United States Patent [19]

Harada et al.

[11] Patent Number: 4,651,001

[45] Date of Patent: Mar. 17, 1987

[54] VISIBLE/INFRARED IMAGING DEVICE WITH STACKED CELL STRUCTURE

[75] Inventors: Nozomu Harada; Okio Yoshida, both of Yokohama, Japan

[73] Assignee: Kabushiki Kaisha Toshiba, Kawasaki, Japan

[21] Appl. No.: 681,188

[22] Filed: Dec. 13, 1984

[30] Foreign Application Priority Data

Dec. 19, 1983 [JP] Japan ................................ 58-239382

[51] Int. Cl.[4] ...................... H01L 27/14; H01L 31/04
[52] U.S. Cl. .................................. 250/330; 250/332; 250/370; 250/339; 357/15; 357/24; 357/30; 357/83
[58] Field of Search .......... 250/370 E, 370 G, 370 K, 250/370 L, 338 SE, 390, 339, 332, 349, 330, 352; 357/24 LR, 30, 32, 15, 83

[56] References Cited

U.S. PATENT DOCUMENTS

| | | | |
|---|---|---|---|
| 3,902,066 | 8/1975 | Roosild et al. | 250/330 |
| 3,962,578 | 6/1976 | Roschen | 250/339 |
| 4,214,264 | 7/1980 | Hayward et al. | 357/30 |
| 4,238,760 | 12/1980 | Carr | 357/30 |
| 4,316,206 | 2/1982 | Bottka et al. | 357/30 |
| 4,423,325 | 12/1983 | Foss | 250/332 |
| 4,443,701 | 4/1984 | Bailey | 250/332 |
| 4,581,625 | 4/1986 | Gay et al. | 357/30 |

OTHER PUBLICATIONS

Y. Terui et al.; "A Solid-State Color Sensor Using $Zn_{1-x}Cd_xTe$ Heterojunction Thin-Film Photoconductor ISSCC80, WAM2.6, pp. 34–35, 1980.
W. F. Kosonocky et al; "Schottky-Barrier Infrared Image Sensors", RCH Engineer, 27-3, May, Jun., 1982.

*Primary Examiner*—Carolyn E. Fields
*Attorney, Agent, or Firm*—Oblon, Fisher, Spivak, McClelland & Maier

[57] ABSTRACT

A solid-state image sensing device such as an IT-CCD has first and second photosensing sections which are stacked so that they separately sense visible and infrared image light components contained in input light. The visible image light component contained in image light irradiated through a transparent layer is absorbed by a silicon amorphous layer, thereby sensing a visible image. The remaining light component is transmitted through an insulative layer, and is irradiated into an n+ diffusion layer which consists of a Schottky diode and serves as the second photosensing section. The infrared image light component is absorbed in the Schottky diode, thereby sensing the infrared light image.

15 Claims, 10 Drawing Figures

F I G. 1
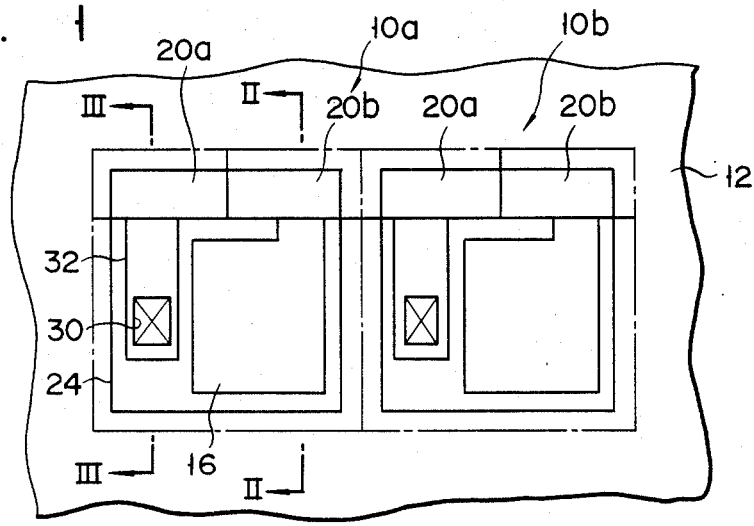
F I G. 2
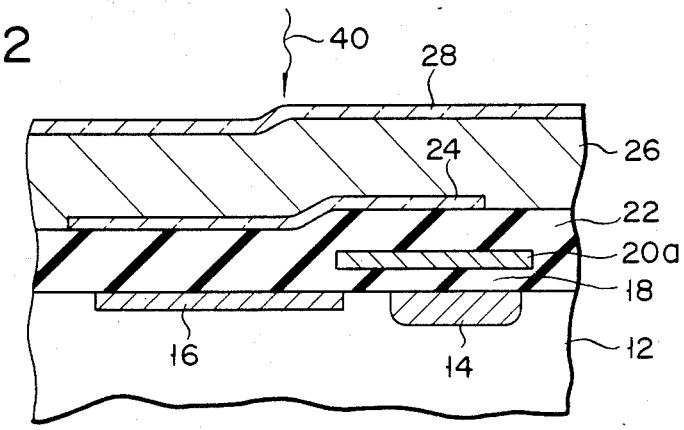
F I G. 3
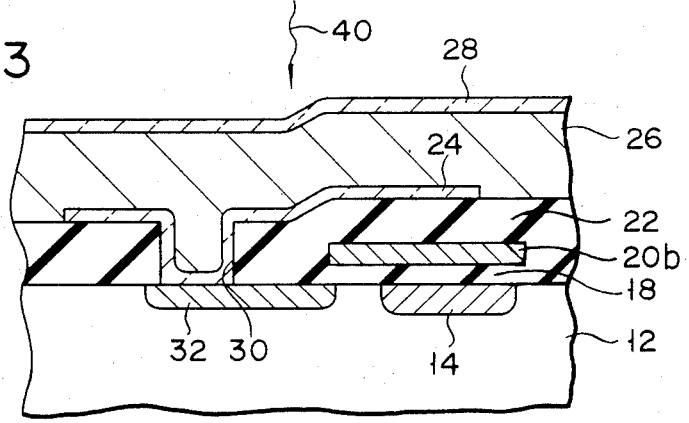

VISIBLE/INFRARED IMAGING DEVICE WITH STACKED CELL STRUCTURE

BACKGROUND OF THE INVENTION

1. Field of the Invention

The present invention relates in general to a solid-state imaging device and, more particularly, to a solid-state image sensor having photosensitivity or being photosensitive to a plurality of different wavelength ranges such as visible light and infrared light wavelength ranges.

2. Discussion of Background

Although developed largely for military purposes, infrared imaging devices have been important in industrial, commercial, and scientific applications. For example, infrared imaging systems, which include a solid-state infrared image sensor, where developed to achieve a nighttime aerial photographic capacity.

As generally known, a solid-state imaging device comprises photosensing cells which are arranged in a matrix form on a semiconductor substrate. When a plurality of irradiation light components respectively having different wavelength ranges (e.g., visible light and infrared light) is detected using a solid-state imaging device such as a charge-coupled device (to be referred to as a "CCD" hereinafter), CCDs for visible light and infrared light wavelength ranges are used. In this case, there is prepared, an image sensor chip in which a photosensing cell for visible light and a photosensing cell for infrared light are formed to be adjacent.

However, in solid-state imaging devices of this type, since photosensing sections independently sensing light components of different wavelength ranges are formed adjacently on a single substrate, the pixel density as input light of one wavelength range becomes undesirably halved. In other words, high-density images cannot be obtained at the same time as input light containing two different wavelength ranges.

SUMMARY OF THE INVENTION

It is therefore an object of the present invention to provide a solid-state imaging device in which photosensing cells independently sensing light components of different wavelength ranges are formed on a single substrate at a high density, and which can obtain a quality visible image.

According to the solid-state image sensing device of the present invention, a first photosensing section which generates a first charge packet or signal charge by sensing irradiation light having a first wavelength range, and a second photosensing section which generates a second charge packet or signal charge by sensing irradiation light having a second wavelength range are stacked and formed on a semiconductor substrate. In this case, when the first photosensing section senses an infrared image component while the second photosensing section senses a visible image component, the infrared image component in the irradiation light passes through the overlying second photosensing section and reaches the underlying first photosensing section, thereby being subjected to the image-sensing operation. The stacked structure of the first and second photosensing sections contributes to the higher integration of these sections sensing light components of the different wavelength ranges.

BRIEF DESCRIPTION OF THE DRAWINGS

The present invention is best understood by reference to the accompanying drawings, in which:

FIG. 1 is a partial plan view showing a photosensing section of a visible/infrared image-sensing device according to a first embodiment of the present invention;

FIG. 2 is a cross-sectional view along line II—II of the visible/infrared image-sensing device of FIG. 1;

FIG. 3 is a cross-sectional view along line III—III of the visible/infrared image-sensing device of FIG. 1;

DETAILED DESCRIPTION OF THE PREFERRED EMBODIMENTS

Figure 4:
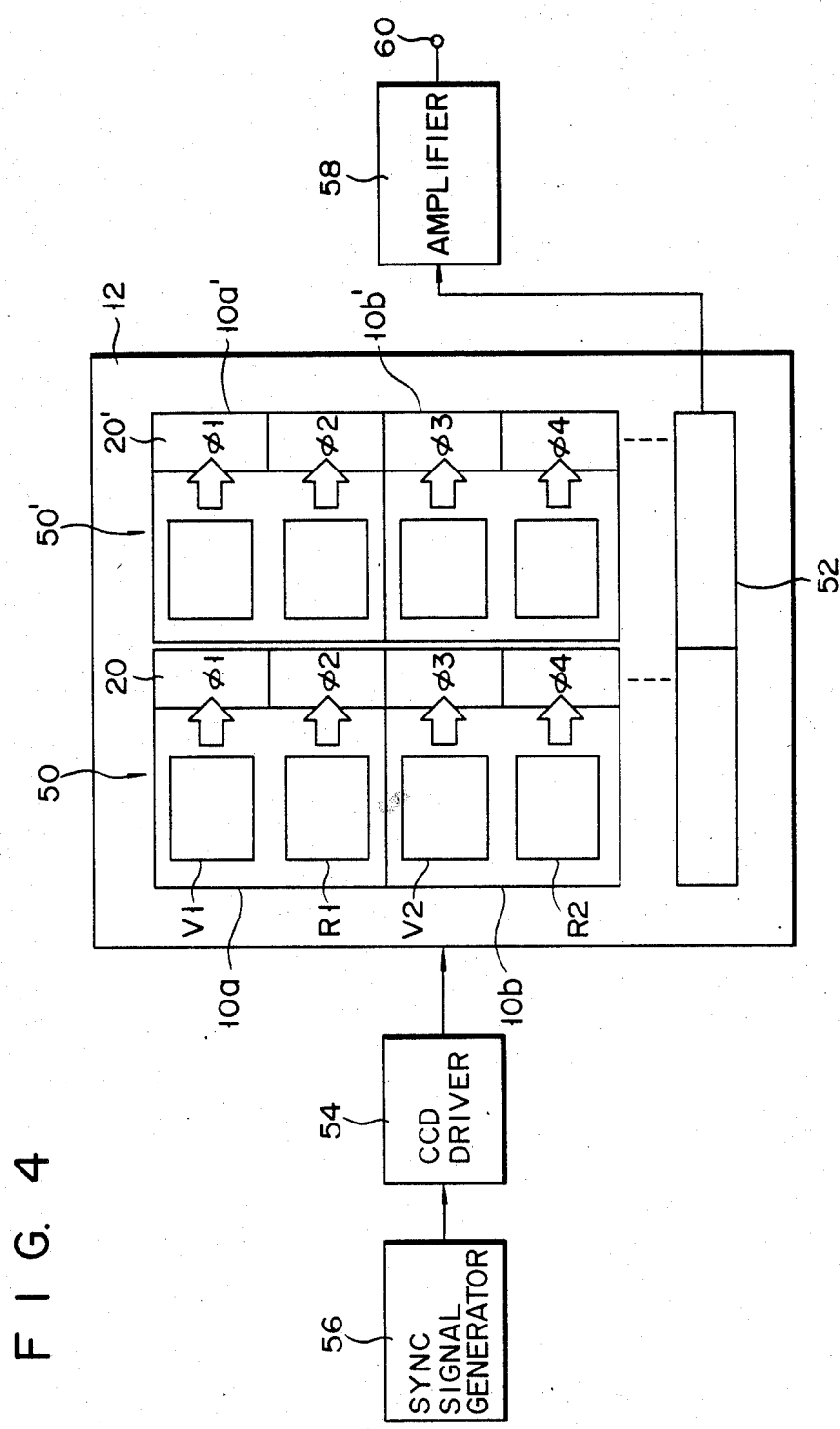
FIG. 4 is a block diagram showing a main part of a system for sensing infrared light and visible light images.

Referring now to FIG. 1, an image-sensing device such as a CCD as a first embodiment of the present invention is partially illustrated. This CCD element comprises an interline-transfer type CCD (to be referred to as an "IT-CCD" hereinafter). The IT-CCD has a photosensitivity corresponding to two different light wavelength ranges. In the embodiments to be described hereinafter, an image-sensing device has photosensitivities with respect to two irradiation light wavelength ranges, i.e., visible light and infrared light wavelength ranges. Therefore, the IT-CCD can sense not only a visible image, but also an invisible infrared image.

According to the partial plan view shown in FIG. 1, two cells 10a and 10b among a plurality of photosensing cells which are arranged in a matrix on a semiconductor substrate such as a silicon substrate 12 are partially shown. The two cells 10a and 10b are arranged along a CCD transfer direction. The two cells 10a and 10b constitute one stage of the CCD element.

FIG. 2 is an enlarged cross-sectional view along a line II—II of the plan view of FIG. 1. The substrate 12 is formed of, for example, a silicon of p-type conductivity. An n+ semiconductive layer 14 is formed on the substrate 12. The n+ semiconductive layer 14 serves as a vertical CCD transfer channel for reading charge packets or signal charges generated by the photoelectric conversion of irradiated light. In one pixel region of the substrate 12, a platinum-silicon compound layer (to be referred to as "Pt-Si layer" hereinafter) 16 is formed adjacent to the n+ layer 14. The Pt-Si layer 16 consists of a Schottky diode having photosensitivity for infrared radiation. The Schottky diode 16 serves as the first infrared photosensing section in the pixel of the image sensor.

A gate insulation film or insulative layer 18 formed of a silicon oxide material is deposited on the substrate 12, as shown in FIG. 2. A conductive layer 20a is formed on the gate insulation film 18 so as to overlay the n+ layer 14. The conductive layer 20a functions as a transfer gate electrode. A gate insulation or insulative layer 22 is further stacked on such a structure. As a result, the transfer gate electrode layer 20a is sandwiched between the insulative layers 18 and 22. In other words, the gate electrode layer 20a is electrically insulated from the substrate 12, and the layers 14 and 16.

The first radiation photosensing section 16 for sensing infrared radiation is formed on the substrate 12. Its upper surface is covered by the insulative layers 18 and 22. A transparent electrode 24 of $In_2O_3$ is formed on the insulative layer 22 so as to cover one pixel region. The transparent electrode 24 serves as a pixel electrode. A photoconductive layer or amorphous silicon layer 26 serving as a second photosensing section is prepared on this structure. The amorphous silicon layer 26 is photosensitive to a predetermined visible light wavelength range so as to sense visible radiation. Another transparent electrode 28 of $In_2O_3$ is formed on the top surface of the amorphous silicon layer 26. To summarize, the first photosensing section 16 for sensing only infrared image radiation and the second photosensing section 26 for sensing only visible image radiation are stacked on the substrate 12 in the order named (two-layered structure).

As shown in FIG. 3, an opening 30 is formed in the insulative layers 18 and 22. An n+ semiconductive layer 32 is formed in the surface of the substrate 12 corresponding to the position of the opening 30. The n+ layer 32 is adjacent to the Schottky diode 16 shown in FIG. 2 and serves as a charge accumulating diode. Since the underlying transparent electrode 24 as a pixel electrode is deposited on the insulative layers 18 and 22, it is electrically connected to the n+ layer 32, as shown in FIG. 3.

Note that in FIG. 3, reference numeral 20b denotes a second transfer gate electrode provided in the cell 10a. The second transfer gate electrode 20b is buried in the insulative layers 18 and 22 in the same manner as in the first transfer gate electrode 20a. The structure of the neighboring cell 10b is the same as that of the cell 10a, and a detailed decription thereof is omitted.

Image light 40 is irradiated through the amorphous silicon layer 28, as illustrated in FIGS. 2 or 3. In this case, the amorphous silicon layer 26 as the second photosensing section absorbs a visible wavelength light component ($\lambda = 0.4$ to $0.7$ $\mu m$) contained in the input image light 40, thereby generating signal charges (in this case, electrons). The signal charges or electrons are drifted toward the electrode 24 by an electric field generated in the amorphous silicon layer 26 due to the application of voltage between the upper and lower transparent electrodes 28 and 24. An infrared wavelength light component contained in the input image light 40 from which the visible wavelength component is excluded passes through the pixel electrode 24 and is irradiated in the Pt-Si layer 16 as the first photosensing section, thus being subjected to the image-sensing operation. It should be noted that although absorption of an infrared wavelength light component in the pixel electrode 24 naturally occurs, the absorption amount thereof is very small and can be ignored.

According to the image-sensing device of the present invention, when light is irradiated, the infrared light component having a longer wavelength than that of the visible light contained in the input image light is sensed by the first photosensing section 16 which is directly formed on the substrate 12 while the visible wavelength light component contained in the input light is sensed by the second photosensing section 26 which is stacked on the first photosensing section 16. When a positive transfer pulse signal is supplied to the transfer gate electrode 20a, the signal charges generated and accumulated by photoelectric conversion by the first photosensing section, that is, the Pt-Si layer 16, are transferred to the n+ layer 14 and are read out. In this case, the transferring operation of the signal charges to the n+ layer 14 is performed by sequentially applying four-phase negative clock pulses $\phi 1$, $\phi 2$, $\phi 3$ and $\phi 4$ to the transfer gate electrode 20a and to the transfer gate electrodes adjacent thereto.

Meanwhile, the signal charges corresponding to the visible light image generated in the amorphous silicon layer 26 by absorption of the visible light are drifted toward the pixel electrode 24 and are accumulated in an accumulation diode consisting of the n+ layer 32. The signal charges accumulated in the n+ layer 32 are transferred to the n+ layer 14 by applying a positive pulse signal to the transfer gate electrode 20b in the same manner as for the Pt-Si layer 16, and are read out from the n+ layer 14.

According to the first embodiment, one stage of the CCD element consists of two neighboring photosensing cells. When the positive pulses are applied to the first transfer gate electrode 20a of each cell of these two cells 10a and 10b, the signal charges generated in the amorphous silicon layer 26 provided on the pixel electrode 24 are read out by the transfer gate electrode 20b. On the other hand, when the positive pulses are applied to the second transfer gate electrode 20b of one cell 10a and to the first transfer gate electrode 20a of the other cell 10b, the signal charges generated in the Pt-Si layer 16 of each pixel are read out by the transfer gate electrode 20a.

The pixel electrode 24, connected to the n+ layer 32 comprising the charge accumulation diode, is made of a material which can transmit light components of the infrared wavelength range. The amorphous silicon layer 26, serving as the second photosensing section for sensing visible light components, is stacked on the Pt-Si layer 16 which serves as the first photosensing section for sensing infrared light (two-layered structure). Therefore, the packing density of the two photosensing sections having different photosensing ranges and formed on the substrate 12 which has an identical area can be substantially doubled in comparison with that of the prior art in which two cells having different photosensing ranges are alternately arranged on the single surface of the substrate 12. As a result, the density of the two cells having different photosensing ranges on the substrate 12 can be substantially doubled.

With respect to the visible light component of the input light, the continuously formed amorphous silicon layer 26 itself serves as a photosensing section. Therefore, the size of the opening 30 of the insulative layers 18 and 22 necessary for connecting the pixel electrode 24 to the accumulation diode 32 provided in the surface portion of the substrate 12 can be minimized. As a result, although the first and second photosensing sections are packed in one pixel cell region, a CCD chip photosensitive to both visible and infrared light can have a higher integration.

FIG. 4 shows the CCD arrangement, that is, the image-sensing device including the visible/infrared light image sensor described with reference to FIGS. 1 to 3. FIG. 4 mainly shows the image signal output operation of the visible/infrared light image sensor of the first embodiment of the present invention. In FIG. 4, the interior of the sensor is schematically illustrated. The image-sensing device of FIG. 4 performs the interlace imaging operation in accordance with a television system in which one frame image is set to have a two-field (A and B fields) image.

A plurality of unit cells, each of which comprises two pixels shown in FIG. 1, is arranged in a matrix. In FIG. 4, only four cells 10a, 10b, 10a' and 10b' are illustrated. As described above, each cell 10a, 10b, 10a' or 10b' has a visible light sensing section (or the amorphous silicon layer 26) and an infrared light sensing section (or the Pt-Si layer 16). The photosensing sections which sense the different wavelengths of light contained in the input light are stacked to have a "two-layered structure" in one pixel region of the substrate 12. However, it should be noted that in FIG. 4, the cells are illustrated for convenience as if they were arranged in an identical plane of the substrate 12. For the same reason, in FIG. 4, the visible light sensing section 26 is denoted by "V" and the infrared light sensing section 16 is denoted by "R." Therefore, one cell 10a of a pair of cells comprises a visible light sensing section V1 and an infrared light sensing section R1, while the other cell 10b comprises a visible light sensing section V2 and an infrared light sensing section R2. Note that a horizontal CCD shift register 52 is provided on the substrate 12 and in the final stage of transfer gate electrodes.

A CCD driver 54 is electrically connected to the image sensor of this embodiment. The CCD driver 54 serves to control the image-sensing operation of the IT-CCD image sensor in response to a sync pulse signal generated from a sync signal generator 56. An image sensing signal (CCD output signal) from the IT-CCD image sensor is connected to an output terminal 60 through an amplifier circuit 58.

Figure 5A:
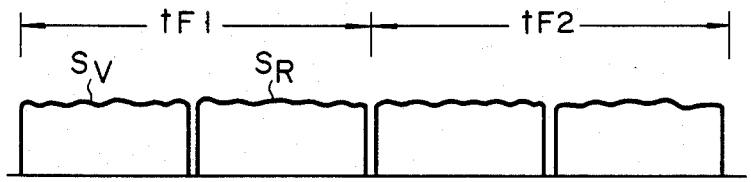
FIGS. 5A and 5B are respectively waveform charts of an image signal for explaining a reading method of infrared light and visible light image signals from the visible/infrared image-sensing device of FIG. 1.

When positive pulses $\phi 1$ and $\phi 2$ are applied to the respective first gate electrodes of the pair of photosensing cells 10a and 10b, a visible image signal is read out from the visible light sensing sections V1 and V2. On the other hand, when positive pulses $\phi 2$ and $\phi 4$ are applied to the respective second transfer gate electrodes 20b of the pair of photosensing cells 10a and 10b, an infrared image signal can be read out from the infrared light-sensing sections R1 and R2. Such a readout operation of the visible and infrared image signals is performed in synchronism with the sync pulse signal from the sync signal generator 56 under the control of the CCD driver 54. Therefore, as shown in FIG. 5A, only a visible image signal SV is read out in an A field period ta1 included in a frame period tF1, and only an infrared image signal SR is read out in a following B field period included in this frame period tF1. In the following frame period tF2, the same operation as that in the frame period tF1 is performed. Such a signal readout method is suitable for processing the visible light image in one field period (ta) and for processing and calculating the infrared light image in the other field period (tb).

Figure 5B:
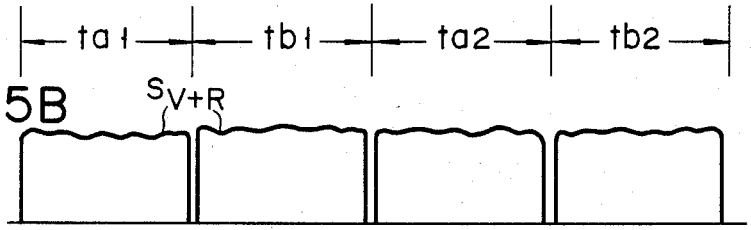

In the image signal readout operation, as shown in FIG. 5B, the visible and infrared image signals can be simultaneously read out in the field period ta or tb. In this case, a visible/infrared image signal SV+R which consists of the visible and infrared image signals SV and SR is generated from each pixel, thereby realizing a CCD image sensor able to sense a wider wavelength range.

According to the visible/infrared image sensor, two pixels constitute one vertical CCD element. For this reason, as is well-known to those skilled in the art, (i) image signals from the two pixels arranged along a vertical direction are read out in one stage of the CCD element, and (ii) the interlace image-sensing operation is performed between the image signal of this field period and the image signal of the following field period, thereby obtaining the same number of space sampling points as that of the initial pixels of the image sensor. As a result, the degradation of the resolution of a reproduced image can be prevented.

Figure 6:
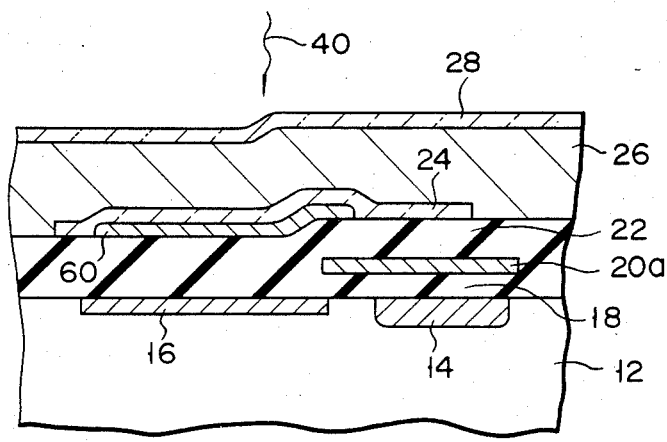
FIG. 6 is a partial cross-sectional view showing a structure of a main part of a visible/infrared image-sensing device as a second embodiment of the present invention in which an optical filter layer is additionally provided.

FIG. 6 shows a cross-sectional view of a visible/infrared image sensor according to the second embodiment of the present invention. FIG. 6 corresponds to FIG. 2, and the same reference numerals as in FIG. 2 denote the same parts in FIG. 6.

According to this embodiment, an optical filter film or band pass filter 60 is formed on the gate insulation layer 22 to cover the Schottky diode 16. The optical filter film 60 is provided for transmitting a light component of a desired wavelength range, i.e., the infrared light component. When the optical filter film 60 is set to transmit, for example, the light component of the 4-$\mu$m wavelength range, it is formed of multilayers of Ge and ZnSe. The lower transparent substrate 24 extends over the filter film 60. In other words, the optical filter film 60 is additionally provided so as to be sandwiched between the insulative layer 22 and the transparent electrode 24. The filter film 60 is provided between the visible image sensing section and the infrared image sensing section which are stacked by forming the infrared image sensing section as an underlying layer.

When the input light 40 containing the visible and infrared light components is irradiated on this image sensor, the visible light components are absorbed in the overlying amorphous silicon layer 26. The amorphous silicon layer 26 senses the visible image. Light components other than the visible light components reach the filter layer 60. The filter layer 60 transmits only the infrared light components of the input light, and absorbs other light components, e.g., ultraviolet radiation and the like, which are thereby filtered off. As a result, only a pure infrared light image is irradiated in the Pt-Si layer 16. Therefore, a good infrared light image signal in which background noise is minimized can be obtained.

Figure 7:
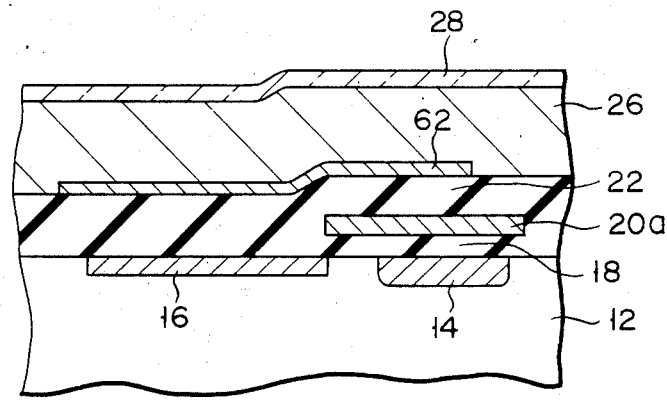
FIG. 7 is a partial sectional view showing the structure of the main part of a modification of the visible/infrared image-sensing device of FIG. 6.

FIG. 7 shows a modification of the optical filter layer 60. When the filter layer 60 is composed of a Ge-ZnSe multilayer as described above, these materials Ge and ZnSe because they are semiconductor materials have a smaller resistance than that of the amorphous silicon layer 26 for sensing the visible image component. Therefore, in FIG. 7, reference numeral 62 denotes a layer comprising a Ge-ZnSe multilayer. The layer 62 serves not only as a filter layer, but also as a transparent electrode. In this modification, the same technical advantages as that of the embodiment shown in FIG. 6 can be obtained.

Figure 8:
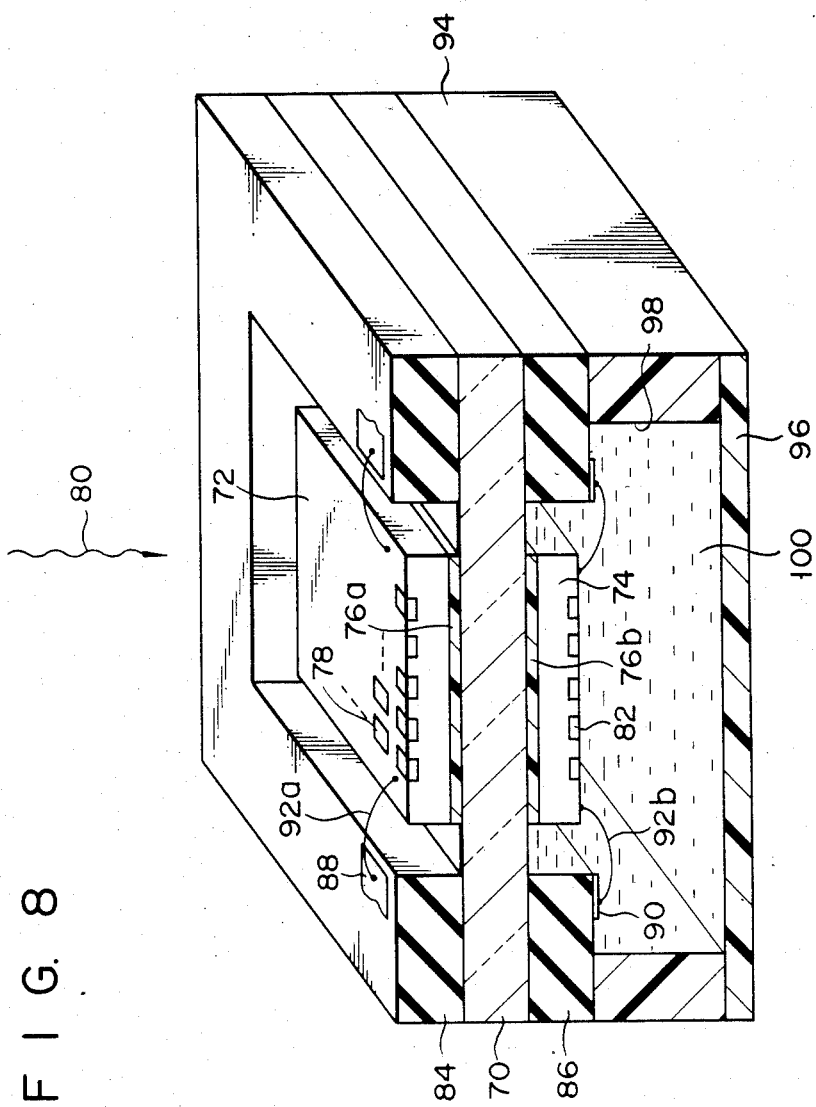
FIG. 8 is a partially sectional perspective view of a visible/infrared image-sensing device as a third embodiment of the present invention in which an arrangement for cooling an infrared image-sensing section to a proper temperature using liquid nitrogen is additionally provided.

FIG. 8 shows a cross-sectional view of a third visible/infrared image sensor of the present invention. A transparent substrate 70 represents higher transmittance with respect to the light components of a predetermined wavelength range. Two photosensing substrates (to be respectively referred to as first and second photosensing substrates hereinafter) or visible and infrared image sensing sections 72 and 74 are adhered by adhesive layers 76a and 76b on the upper and lower surfaces of the substrate 70 to be opposite each other. The positions of the photosensing substrates 72 and 74 are coincident. The photosensing substrate 72 is formed of amorphous silicon. The photosensing substrate 72 comprises a plurality of photosensing cells 78 photosensitive to visible light and arranged in a matrix. The photosensing substrate 72 senses the visible light image contained in input light 80. The photosensing substrate 74 has a plurality of photosensing cells 82 photosensitive to infrared light and arranged in a matrix. The photosensing substrate 74 senses the infrared image which is contained in the input light 80 and is input through the transparent substrate 70. Therefore, the adhesive layers 76a and 76b must be formed of materials which can transmit infrared light.

According to this image sensor, the visible image components contained in the input light 80 are absorbed by the photosensing substrate 72. Other light components of the input light 80 are irradiated on the photosensing substrate 74 through the transparent substrate 70 and the adhesive layers 76a and 76b. The infrared image components of the input light 80 are absorbed by the photosensing substrate 74. When the photosensing substrate 74 is formed of, for example, a compound semiconductor material such as InSB, CdHgTe, or the like, signal charges are generated in the substrate 74 in response to radiation of the input light 80. Meanwhile, when the substrate 74 comprises a Schottky junction structure of, e.g., Pt-Si, W-Si or the like, the signal charges are generated in the Schottky junction portion in response to radiation of the input light 80.

Ceramic plates 84 and 86 are formed on each surface of the transparent substrate 70 so as to surround the first and second photosensing substrates 72 and 74, respectively. Metallic wiring patterns 88 and 90 for signal transmission are formed on the ceramic plates 84 and 86. The first and second photosensing substrates 72 and 74 are electrically connected to the wiring patterns 88 and 90 through connecting wires 92a and 92b by the well-known wire-bonding technique, respectively.

A housing 94 is mounted on the surface of the ceramic plates 86 (i.e., the second photosensing substrate 74 of the transparent substrate 70). A cover plate 96 is adhered to the top surface of the housing 94, thereby defining a space 98 which is enclosed by the transparent substrate 70 and the housing 94. Liquid nitrogen 100 is sealed in the closed space 98, thereby cooling the second photosensing substrate 74 to the temperature of liquid nitrogen. On the other hand, the first photosensing substrate 72 which is positioned at the opposite surface of the transparent substrate 70 with respect to the second photosensing substrate 74 is stably held in a dried nitrogen gas atmosphere. The temperature of this nitrogen gas atmosphere is determined by the operation characteristics of the first photosensing substrate 72. In such a structure for cooling the photosensing substrates 72 and 74, a temperature gradient is formed between the photosensing substrates 72 and 74 having the transparent substrate therebetween.

It is very important to cool the Pt-Si Schottky diode portion to a temperature close to that of liquid nitrogen and to suppress the flow of a dark current at the Pt-Si Schottky diode portion so that a structure for cooling the photosensing substrates 72 and 74 as described above is added to the image sensor of the present invention. Control of the flow of the dark current at the Pt-Si Schottky diode portion, that is, the infrared image sensing section 74 can improve the S/N ratio of the infrared image signal obtained therefrom. It should be noted that when the visible image sensing section 72 is cooled to a low temperature in the manner as described above, it results not only in good control of the dark current, but also in undesirable degradation of the image quality due to the generation of afterimage and/or burning on the reproduced image picture. Such kind of image degradation appears because the signal charges generated by radiated light are trapped at trapping level in the amorphous silicon material. Amorphous silicon has a higher trap density, generally hundreds or thousands that of single-crystalline silicon. Therefore, the problem of an afterimage and/or burning due to the trapping of charges at a low temperature is very serious in the image sensing operation.

According to the third embodiment with the specific cooling arrangement, the visible image sensing section 72 opposite the infrared image sensing section 74 and directly cooled by liquid nitrogen having a transparent substrate 70 therebetween is in a nitrogen gas atmosphere, thereby forming a temperature gradient. This temperature gradient is formed to be higher toward the visible image sensing section 72 (e.g., to be set to fall within the range between $-10°$ to $20°$ at section 72). Therefore, the temperature of the sensing section 72 can effectively control the trap phenomenon of the charges that cause the appearance of afterimages and/or burning. Furthermore, within the above temperature range, the flow of the dark current is negligible. Therefore, noise components caused by the dark current, image defects and the like can be reduced, resulting in a widening of the dynamic range of the obtained image signal.

The thickness of the transparent substrate 70 can be changed by changing the temperature of the dry nitrogen gas atmosphere. Changing the thickness of the transparent substrate 70 is very important in correcting the imaging focus which shifts between the focal depth of the visible image and that of the infrared image. It is known that the focal surface of an infrared image will shift from that of the visible image in the propagating direction of light. The visible/infrared imaging device of the two-layered structure of the present invention can effectively resolve this problem. This is because the temperature of the dry nitrogen gas atmosphere can be changed so that the thickness of the transparent substrate 70 is suitable for correcting imaging focus errors, while the temperature gradient between the photosensing substrates 72 and 74 is kept constant. In this case, the visible image contained in the input light can be precisely focused on the upper sensing section 72, and the residual infrared image is transmitted through the thickness controlled transparent substrate 70. Thereafter, it can be focused on the lower sensing section 74. Therefore, according to the arrangement of the third embodiment, the respective photosensing substrates 72 and 74 can be effectively cooled so as to have the desired temperatures, respectively, and both the visible and infrared images are precisely in focus, thereby providing higher resolution and a good reproduced image.

Figure 9:
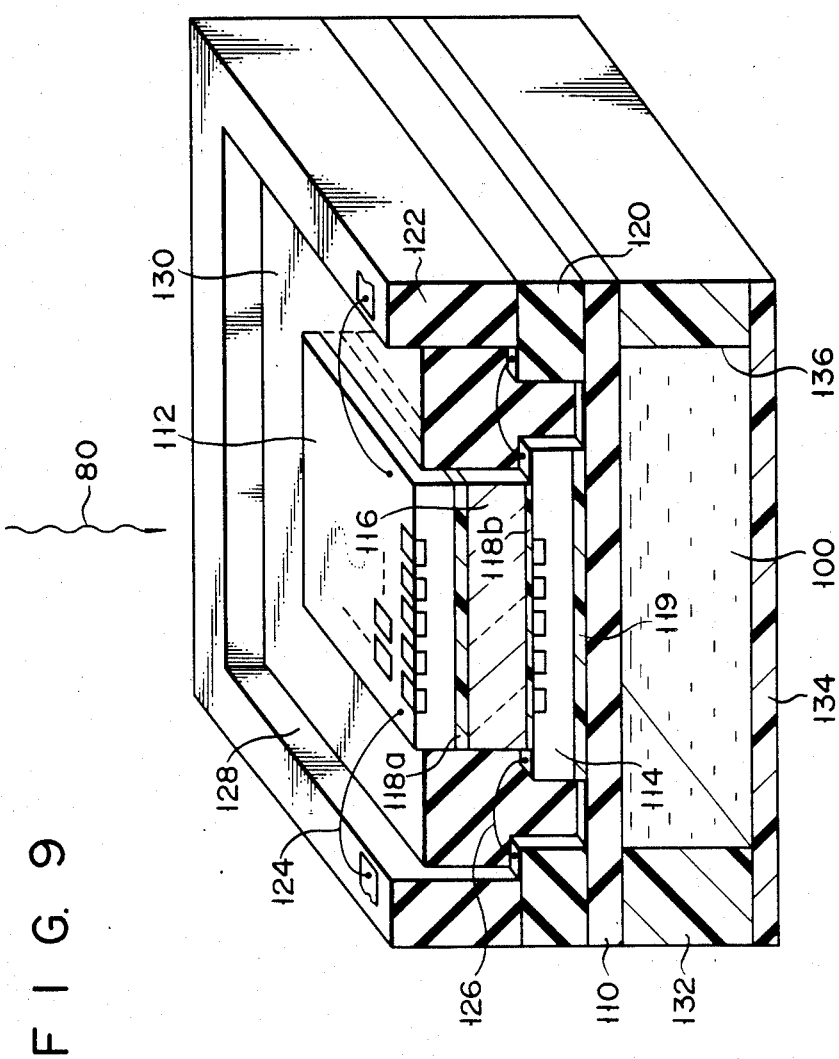
FIG. 9 is a partially sectional perspective view showing a modification of the visible/infrared image sensing device of FIG. 8.

FIG. 9 shows a modification of the third embodiment. A two-layered structure of visible and infrared image sensing sections 112 and 114 is mounted on an upper surface of an insulative substrate 110 thinner than the transparent substrate 70. A transparent substrate 116 is sandwiched between the visible and infrared image sensing sections 112 and 114 by adhesive layers 118a and 118b. The two-layered structure of the image-sensing sections 112 and 114 is attached to the upper surface of the insulative substrate 110 by an adhesive layer 119. A ceramic plate member 120 and a wall member 122 are sequentially formed to surround the image-sensing sections 112 and 114 on the insulative substrate 110. Wiring patterns 124 and 126 electrically connect wiring patterns (not shown) provided on the image-sensing sections 112 and 114 and the members 120 and 122, respectively. A layer 130 formed of an insulative material having uniform heat conduction is buried in a space 128 defined in the members 120 and 122. As clearly illustrated in FIG. 9, the layer 130 is in direct contact with the respective side surfaces of the image-sensing sections 112 and 114. Bonding wires 126 for connecting the infrared image sensing section 114 and the plate member 120 are buried in the insulative layer 130.

A housing 132 is mounted on the lower surface of the insulative substrate 110. A cover plate 134 is adhered to a top surface of the housing 132, thereby defining a closed space 136. The liquid nitrogen 100 is sealed in the closed space 136, thereby indirectly cooling the infrared image sensing section 114 through the insulative layer 110 to a temperature of liquid nitrogen of 77 K or less. Such an arrangement is used to obtain a moderate temperature gradient between the visible and infrared image sensing sections 112 and 114 as in the third embodiment. In addition, when the respective cooling temperatures are close to each other, this arrangement is convenient.

Although the present invention has been shown and described with reference to specific embodiments, various changes and modifications which are obvious to a person skilled in the art are deemed to lie within the spirit and scope of the invention.

For example, in the above embodiments, the IT-CCD is used as a signal charge readout portion. However, the present invention is not limited to this. For example, other devices such as a X-Y addressing type charge priming device (CPD) can be applied. Although the amorphous silicon layer is used for the visible image sensing section and the Pt-Si Schottky diode is used for the infrared image sensing section, other semiconductor layers such as a photoconductive layer, e.g., Se-As-Te, ZnSe-ZnCdTe or the like can be used instead of amorphous silicon. In the same manner, other semiconductor junction structures such as $Pd_2Si$, $IrS_2$, $Pt_2Si$, $NiSi$, $WSi_2$, $TiSi_2$ or the like can be used instead of the Pt-Si Schottky diode.

Furthermore, in the above embodiments, although infrared light is sensed as a radiation image having a wavelength range other than the visible image, the present invention can be modified so as to sense an image represented by, e.g., X-rays, ultraviolet radiation, or the like.

What is claimed is:

1. A solid-state image sensing device comprising:
   a semiconductive substrate having a cell region;
   a first photosensing section, which is formed on said substrate and within the cell region thereof, said second section comprising means for generating a first charge packet or signal charge by sensing an infrared image light component contained in input light;
   a second photosensing section, which is stacked over said first photosensing section to be included in the cell region of said substrate, said second section comprising means for generating a second charge packet or signal charge by sensing a visible image light component which is contained in the input light; and
   readout means connected to said first and second photosensing sections, for reading out the first and second signal charges, said readout means comprising,
   a transfer channel layer which is formed in said substrate, said transfer channel layer comprising means to transfer the first and second signal charges, and
   a gate electrode layer which is formed over said transfer channel section and partially overlap with said first and second photosensing sections, said gate electrode layer comprising means for receiving a pulse signal and for shifting the first and second signal charges into said transfer channel section in response to the pulse signal.

2. The device according to claim 1, wherein said gate electrode layer is so formed as to be included in the cell region of said substrate and serves as a common gate electrode of said first and second photosensing sections.

3. The device according to claim 2, wherein said first photosensing section includes a Schottky type photodiode having a Schottky junction construction which is formed on said semiconductor substrate.

4. The device according to claim 3, wherein said second photosensing section includes a photoconductive layer, said photoconductive layer comprising means for receiving the visible image light component contained in the input light and for generating corresponding signal charges, said photoconductive layer being formed of an amorphous semiconductor material, and extending above said Schottky type photodiode so as to be electrically insulated from said Schottky type photodiode.

5. The device according to claim 4, further comprising:
   an insulative layer, which is formed on said Schottky type photodiode formed on said semiconductor substrate for electrically insulating said photoconductive layer from said Schottky type photodiode.

6. The device according to claim 5, further comprising:
   a semiconductor diffusion layer which is formed to be adjacent to said Schottky type photodiode formed on said semiconductor substrate and to constitute an electric charge accumulation diode.

7. The device according to claim 6, wherein said insulative layer has an opening positioned on said diffusion layer; and said second photosensing section further includes a pixel electrode which is formed on said insulative layer and is brought into electrical contact with said semiconductor diffusion layer through said opening formed in said insulative layer, said pixel electrode causing the signal charges from said second photosensing section to be read out through said semiconductor diffusion layer.

8. The device according to claim 7, further comprising:
optical filter means, which is formed between said first and second photosensing sections, for filtering a remaining image light component, so as to transfer only the infrared image light component contained in the remaining image light component to said Schottky type photodiode, when the remaining image light component other than the visible image light component which is contained in the input light and is absorbed by said photoconductive layer of said second photosensing section is transmitted through said second photosensing section and irradiated onto said first photosensing section.

9. The device according to claim 2, further comprising:
optical filter means, which is formed between said first and second photosensing sections, for filtering a remaining image light component so as to transfer only the infrared image light component contained in the remaining image light component to said first photosensing section, when the remaining image light component other than the visible image light component which is contained in the input light and is absorbed by said second photosensing section is transmitted through said second photosensing section and irradiated onto said first photosensing section.

10. A solid-state image sensing device comprising:
a semiconductive substrate having a cell region;
a first photosensing section, which is formed on said substrate and within the cell region thereof, said first section comprising means for generating a first charge packet or signal charge by sensing infrared image light component contained in input light;
a second photosensing section, which is formed over said first photosensing section to be included in the cell region of said substrate, said second section comprising means for generating a second charge packet or signal charge by sensing visible image light component which is contained in the input light; and
a transparent plate which is formed between said first and second photosensing sections and has a thickness corresponding to a focal shift between the visible and infrared images wherein the thickness of said transparent plate is so determined as to
cause the visible and infrared image light components contained in the input light to be focused on said first and second photosensing sections, respectively, and
to obtain a desired temperature gradient formed between said first and second photosensing sections.

11. The device according to claim 10, further comprising:
cooling means for cooling said first photosensing section to a temperature lower than an ambient temperature of said second photosensing section.

12. The device according to claim 11, wherein said cooling means comprises:
a housing for defining, together with said transparent plate, a closed space in which cooling liquid is sealed.

13. The device according to claim 10, further comprising:
cooler means for cooling said first photosensing section for sensing the infrared image light component and for stably keeping said first photosensing section at a predetermined first temperature, so as to minimize the generation of a dark current in an infrared image sensing mode of said first photosensing section.

14. The device according to claim 13, wherein said cooler means forms a temperature gradient between said first and second photosensing sections, and stably maintains a temperature of said second photosensing section at a second temperature higher than the first temperature, so as to minimize the degradation of image quality in a visible image sensing mode of said second photosensing section at the first temperature, and widen a dynamic range.

15. The device according to claim 14, wherein said cooler means comprises means for defining a space in which liquid nitrogen is sealed.

* * * * *